(12) United States Patent
Ngo et al.

(10) Patent No.: US 11,651,933 B1
(45) Date of Patent: May 16, 2023

(54) CATHODE HOLDING ASSEMBLY AND ARC CHAMBER SUPPORT ASSEMBLY WITH THE CATHODE HOLDING ASSEMBLY

(71) Applicant: Plansee USA LLC, Greenville, RI (US)

(72) Inventors: Nam Ngo, Vista, CA (US); Gerhard Duerrhammer, Vista, CA (US); Jacob Boyer, Vista, CA (US); Florian Schaper, Vista, CA (US); Dustin Hacker, Vista, CA (US); Mason Payne, Vista, CA (US); Surf Johnson, Vista, CA (US); Andrew Dalager, Vista, CA (US)

(73) Assignee: E/G Electro-Graph, Inc., Vista, CA (US)

( * ) Notice: Subject to any disclaimer, the term of this patent is extended or adjusted under 35 U.S.C. 154(b) by 0 days.

(21) Appl. No.: 17/871,095

(22) Filed: Jul. 22, 2022

(51) Int. Cl.
*H01J 37/08* (2006.01)
*H01J 37/09* (2006.01)
*H01J 37/317* (2006.01)

(52) U.S. Cl.
CPC .............. *H01J 37/08* (2013.01); *H01J 37/09* (2013.01); *H01J 37/3171* (2013.01)

(58) Field of Classification Search
CPC .......... H01J 37/08; H01J 37/09; H01J 37/3171
See application file for complete search history.

(56) References Cited

U.S. PATENT DOCUMENTS 8,253,334 B2    8/2012   Jerez
2012/0013249 A1*  1/2012   Jerez ..................... H01J 37/08
                                                         313/613

\* cited by examiner

*Primary Examiner* — Donald L Raleigh
(74) *Attorney, Agent, or Firm* — Laurence A. Greenberg; Werner H. Stemer; Ralph E. Locher

(57) ABSTRACT

A cathode holding assembly to be mounted on an arc chamber support of an ion implanter includes a cathode holding plate, an insulator block, and a shield cap. The cathode holding plate has a protruding outer rib towards the shield cap and an opening with a protruding inner rib. A protrusion of the insulator block passes through the opening of the cathode holding plate. The insulator block abuts the protruding inner rib of the opening of the cathode holding plate at an edge of the insulator block to precisely fit the insulator block into the opening of the cathode holding plate. The shield cap is arranged to a side of the insulator block opposing the protrusion. A gap extends between the cathode holding plate and the shield cap, then between the cathode holding plate and the insulator block where it ends.

16 Claims, 4 Drawing Sheets

CATHODE HOLDING ASSEMBLY AND ARC CHAMBER SUPPORT ASSEMBLY WITH THE CATHODE HOLDING ASSEMBLY

FIELD AND BACKGROUND OF THE INVENTION

The present invention relates to a cathode holding assembly for mounting on an arc chamber support of an ion implanter. More particularly, this invention relates to the different parts of the cathode holding assembly and their respective designs, their arrangement among themselves and their arrangement on an arc chamber support. Furthermore, the present invention relates to an arc chamber support assembly with the cathode holding assembly and an arc chamber assembly of an ion implanter with the arc chamber support assembly.

Ion implanters are widely used to modify various regions of a semi-conductor wafer in the manufacture of semi-conductor components, by diffusing or implanting positive or negative ions (dopants) into the surface of the wafer to produce regions having varying properties (like e.g., electrical conductivity). These ion implanters include an arc chamber to generate a plasma containing a variety of ion species to be implanted in the surface of the semi-conductor wafer.

In one known common configuration of an arc chamber, a cathode assembly is located opposite to a repeller (anti-cathode). During operation of the arc chamber the cathode assembly is heated, for example, by a filament, and its purpose is to emit electrons by thermionic emission during operation. The electrons are accelerated into the arc chamber by a relatively positive arc voltage on the arc chamber walls, and an externally generated magnetic field causes the electrons to travel a spiral path into the arc chamber. The emitter and repeller electrodes which are typically biased negatively with respect to the walls of the arc chamber confine the emitted electrons. The combined effect of the emitter and repeller electrodes is to concentrate electrons toward the centre of the arc chamber to maximize interaction with a dopant gas introduced into the arc chamber via a conduit and thereby attain a plasma having the desired properties.

During operation, the arc chamber contains a host of molecular species at very high temperatures. Components, including the components of a cathode holding assembly, in this harsh environment are subjected to conditions that may unduly limit their lifetime or their effectiveness, thus limiting the effectiveness and/or increasing the operating costs of the ion implanter. For example, there is a tendency for films of plasma to be deposited on the parts of a cathode holding assembly, e.g., the cathode holding plate, the insulator block, the shield cap etc. This coating of plasma on the insulator block could cause a short circuit, e.g., between the cathode holding plate and the filament/filament clamps or between the cathode holding plate and the arc chamber or between the filament clamps and the arc chamber, causing a shutdown of the ion source. Accordingly, it is desired to have an extended and tortuous coating path such that the coating process (and correspondingly the generation of short circuits) of electrically isolated parts is prolonged. Further, there are other failure modes such as gas leakage from the arc chamber due to the size of the gaps provided in the cathode assembly. Moreover, the assemblage of a cathode assembly is not so simple and requires a high number of fixtures (e.g., screws, alignment and spacing tools).

Several cathode holding assembly configurations are known from the prior art.

U.S. Pat. No. 8,253,334 B2 discloses an ion source assembly, and arc chamber and an arc chamber support. See, FIG. 10. The arc chamber support is sized to support the arc chamber and it has a forward end with a projection that slide fits into the insulator block. See, FIG. 10B. FIG. 9 shows that the insulator block is provided with undercuts helping to interrupt a conductive coating buildup along surfaces where a coating can cause a short. In this arrangement the insulator block is attached to the arc chamber support by a socket head cap screw and the shield is attached to the graphite support plate by two socket head shoulder screws covering inter alia the insulator block and the graphite support plate whereby the shield has an upper end that is shaped in a bifurcated manner to lie over a major portion of the graphite support plate to maintain the collar in the retainer and the retainer in the support plate. A sleeve that is mounted in the aperture of the arc chamber and projects outwardly thereof into a space within the graphite support plate defines a tortuous gap for throttling a flow of plasma from the internal cavity of the arc chamber.

In the above-mentioned patent, a plasma path is provided having a limited length. Further, the assemblage of the cathode holding assembly according to the prior art requires a lot of fixtures and is not that easy to assemble. It is also known from the prior art that a multiple of tools and working steps are necessary to fasten the parts of the cathode holding assembly among themselves and to attach the cathode holding assembly to the arc chamber support.

Therefore, there is still space for improvement in the design of a cathode holding assembly thereby increasing the lifetime and the effectiveness of a cathode and accordingly, the lifetime and the effectiveness of the arc chamber.

SUMMARY OF THE INVENTION

The primary object of the present invention is to provide a cathode holding assembly which attains longer operating times of an ion implanter. Increasing the operating times has the effect, among others, of lowering the operating costs of an ion implanter as well. Further, it is a purpose of the present invention to provide a cathode holding assembly that is easy to assembly and requires a minimum of tools.

With the above and other objects in view there is provided, in accordance with the invention, a cathode holding assembly to be mounted on an arc chamber support of an ion implanter, the cathode holding assembly comprising:

a cathode holding plate, an insulator block, and a shield cap;

the cathode holding plate being formed with a protruding outer rib towards the shield cap and an opening having a protruding inner rib towards the shield cap;

the insulator block being formed with a protrusion configured to be passed through the opening of the cathode holding plate and to be inserted into a corresponding recess of the arc chamber support, the protrusion of the insulator block being formed with a through-hole for affixing the insulator block to the arc chamber support;

the insulator block abutting the protruding inner rib of the opening of the cathode holding plate at an edge of the insulator block, to ensure that the insulator block fits precisely into the opening of the cathode holding plate; and the shield cap being arranged on a side of the insulator block opposite the protrusion to define a gap extending from between the cathode holding plate and the shield cap, then between the cathode holding plate and the insulator block, and ending there.

In other words, the object of the invention is solved by providing a cathode holding assembly to be mounted on an arc chamber support of an ion implanter comprising: a cathode holding plate, an insulator block, and a shield cap; the cathode holding plate comprises a protruding outer rib towards the shield cap and an opening having a protruding inner rib towards the shield cap and permitting a protrusion of the insulator block to be passed through the opening of the cathode holding plate and to be inserted into a corresponding recess of the arc chamber support; the protrusion of the insulator block comprises a hole extending therethrough for fixture of the insulator block to the arc chamber support; the insulator block abuts the protruding inner rib of the opening of the cathode holding plate at an edge of the insulator block such that the insulator block precisely fits into the opening of the cathode holding plate, and the shield cap is arranged to a side of the insulator block opposing the protrusion such that a gap is defined extending between the cathode holding plate and the shield cap, then between the cathode holding plate and the insulator block where it ends as claimed. The novel cathode holding assembly is intended for mounting on an arc chamber support of an ion implanter. However, the arc chamber support itself does not form part of the invention of a first independent claim. The latter only describes the respective interaction between the parts of the cathode holding assembly. Further, an arc chamber support assembly of an ion implanter is provided wherein the claimed cathode holding assembly is installed having the features as claimed. Additionally, there is disclosed and claimed an arc chamber assembly of an ion implanter using the arc chamber support as outlined.

Further features and details of the invention are provided in the subclaims, the description and the drawings. It goes without saying here that features and details that are described in conjunction with the cathode holding assembly according to the invention also apply in conjunction with the arc chamber support assembly and the arc chamber assembly according to the invention and vice versa, so that, with respect to the disclosure of the individual aspects of the invention, reference is or can always be made from one another.

The inventors found out that the claimed cathode holding assembly provides an extended tortuous coating path compared to the prior art even though only one insulator is used in the assembly. In the above-mentioned Patent No. U.S. Pat. No. 8,253,334 B2 no gap is provided between the insulator and the shield—only undercuts are available between the shield and the insulator. In addition, by using the claimed cathode holding assembly the gas lost from the arc chamber during ion beam operation is reduced since the gaps between the parts of the claimed cathode holding assembly/arc chamber support assembly are smaller compared to the prior art. An extended coating path as well as smaller gaps lead to a longer lifetime of the arc chamber during ion beam operation. Moreover, the claimed cathode holding assembly reduces the frequency of maintenance shutdowns in the arc chamber.

It is one advantage of the present invention that the parts of the claimed cathode holding assembly, i.e., at least the cathode holding plate, the insulator block and the shield cap, are self-aligning. Further, the cathode holding assembly and the arc chamber support are self-aligning. This means that when assembling them together the parts are automatically in the correct position between each other and when mounting on the arc chamber support. The correct distance between the repeller assembly and the cathode assembly is also automatically aligned. As already outlined above, the prior art documents require a lot of fixtures to assemble the ion source assembly to the arc chamber support. By using the claimed cathode holding assembly or arc chamber support assembly it is possible to reduce the number of fixtures (and the number of tools that are required to adjust the fixtures) when assembling the claimed cathode holding assembly and attaching this assembly to the arc chamber support.

Because the ion source assembly is exposed to a high temperature and a chemically rich environment, it is often the case that the single components of the assembly such as screws end up galling to the mating assembly. In this invention, the screws holding the filament clamps to cathode holding plate and cathode holding plate to arc chamber support are preferably attached to mating nuts (see FIG. 4A, lock member 7 and FIG. 3, lock member 11a). In doing so, if galling occurs, the nut and screw can be destructively disassembled without damaging the filament clamp, the cathode holding support or the arc chamber support.

The cathode holding plate of the claimed cathode holding assembly is a monolithic plate having an aperture of circular shape in an upper end for receiving a retainer (housing a filament) and an opening of rectangular shape in a lower end for passing the protrusion of the insulator block. The cathode holding plate comprises—in the area that is covered by the claimed composition—(i.e., the lower end of the cathode holding plate which is arranged opposite to the arc chamber support) a protruding outer rib and a protruding inner rib towards the shield cap. The protruding inner rib is in alignment with the opening of the cathode holding plate. The protruding outer rib overlaps a flange of the insulator block. The cathode holding plate further comprises at least two protruding ribs towards the arc chamber support. However, the arrangement of these ribs will be described later in connection with the arc chamber support assembly.

The cathode holding plate is made either of graphite, of a refractory metal or of a refractory metal-based alloy. Refractory metal refers to the high-melting, base metals of the 5th subgroup (vanadium, niobium and tantalum) and the 6th subgroup (chromium, molybdenum and tungsten). Their melting point is higher than that of platinum (1772° C.). Refractory metal-based alloy can mean a combination of several pure refractory metals (e.g., W and Mo), as well as alloys thereof (e.g., W—Re) and/or compounds thereof. In the context of the invention, refractory metal-based alloy is understood to mean an alloy containing at least 80 wt. %, preferably at least 90 wt. % of one or more refractory metals. Of the refractory metals, Mo and W as well as Mo-based alloys and W-based alloys are particularly suitable. In this context, in a Mo-based or W-based alloy the proportion of Mo (or W) is ≥80 wt. %, in particular ≥90 wt. % or ≥95 wt. %. Molybdenum has a very high melting point, low thermal expansion and high thermal conductivity, which is why Mo or a Mo-based alloy is particularly advantageous (also from a cost point of view).

The insulator block has a protrusion at one end. This protrusion precisely fits into the opening of the cathode holding plate. The protrusion passes through the opening and ends up in a corresponding recess of the arc chamber support when the cathode holding assembly is mounted on an arc chamber support. The protrusion of the insulator block comprises a hole extending throughout the protrusion for fixture of the insulator block to the arc chamber support. Towards the cathode holding plate the insulator preferably comprises a surrounding flange extending between the inner protruding rib and the outer protruding rib of the cathode holding plate. The insulator block abuts the protruding inner rib of the opening of the cathode holding plate at an edge of the insulator block. This edge leads to the generation of a gap between the cathode holding plate and the insulator block. Moreover, this edge of the insulator block results in an arrangement where the protrusion of the insulator block precisely fits into the opening of the cathode holding plate. The insulator block is made of a high temperature ceramic material, preferably $Al_2O_3$ and electrically isolate the cathode holding plate. In addition, the insulator block fixes the cathode holding plate to the arc chamber support when the cathode holding assembly is mounted on an arc chamber support.

The shield cap is arranged to a side of the insulator block opposing the protrusion. In a preferred embodiment the shield cap comprises a surrounding flange which extends towards the cathode holding plate. In a further preferred embodiment, the shield cap is only secured to the insulator block by using at least one fixing device extending from the shield cap to the insulator block. The shield cap is mounted on the insulator block in a floating arrangement such that the gap that is provided between the cathode holding plate and insulator block is extended, i.e., the gap now continues between the shield cap and the insulator block and the shield cap and the cathode holding plate. The shield cap is made out of stainless steel, refractory metal, refractory-metal based alloy, or ceramic. In the above-mentioned Patent No. U.S. Pat. No. 8,253,334 B2 the shield is disposed over the cathode holding plate and the insulator block to prevent formation of a conductive coating on the insulator block, i.e., a floating design is not desired in the prior art.

In a preferred embodiment the shield cap covers the insulator block and the protruding outer rib of the cathode holding plate only. In Patent No. U.S. Pat. No. 8,253,334 B2 mentioned above the shield covers not only the insulator block but also large parts of the graphite support plate and a major portion of the periphery of a collar (see, e.g., FIGS. 3 and 4). Accordingly, the collar of the prior art assembly is maintained in a retainer and the retainer is maintained in the graphite support plate.

As already outlined above, by using the claimed cathode holding assembly a gap is defined between the cathode holding plate, the shield cap, and the insulator block. This gap extends along the cathode holding plate and the shield cap and then between the cathode holding plate and the insulator block where it ends. The size of the gap according to the present invention is 2 mm, preferably 0.4 to 1.5 mm, more preferably 0.5 to 1.0 mm. The gap generates an extended tortuous path which comprises due to the specific design of the different parts of the cathode holding assembly when viewing in the direction from the cup shaped shield to the cathode holding plate at least six turns and at least one side branch. In a preferred embodiment the side branch extends between the shield cap and the insulator block. In a preferred embodiment the shield cap has a double gradation towards an end of the insulator block opposing the protrusion and the fixing device, e.g., a screw, which is used to attach the shield cap to the insulator block. Also, the insulator block might have a step towards the shield cap where the fixing device, e.g., a screw, is located. The gap between the double gradation of the shield cap and the insulator block defines a side branch of the gap. Also, the side branch has preferably a width of ≤2 mm, preferably 0.4 to 1.5 mm, more preferably 0.5 to 1.0 mm. Accordingly, the plasma path is prolonged when compared with the paths disclosed in the prior art. During ion beam operation of the arc chamber such an extended tortuous path delays the buildup of a conductive plasma layer on the surface of the parts of the cathode holding assembly. Thereby the lifetime of a cathode holding assembly during ion beam operation is increased.

In a preferred embodiment of the present invention, the shield cap comprises a surrounding flange extending towards the cathode holding plate, the cathode holding plate comprises the protruding outer rib inside of the surrounding flange that overlaps with the surrounding flange, and the insulator block comprises an outer flange extending inside of the protruding outer rib and towards the cathode support plate. Accordingly, a tortuous path is provided such that the extended tortuous path/gap has seven turns and one side branch.

In a preferred embodiment of the present invention the parts of the cathode holding assembly in particular, the cathode holding plate, the insulator block and the shield cap are geometrically designed in such a way that when these parts are assembled together along an assembling direction, they are self-aligning. So, these parts are positioned with respect to the assembling direction in the correct distance to each other and when mounted on an arc chamber support also correctly and firmly positioned to each other. Since these parts have a corresponding geometrically designed shape the self-aligning features are realized (this will also be described in further detail with regards to the figures). In a preferred embodiment this is achieved by e.g., the surrounding flange of the shield cap overlapping the protruding outer rib of the cathode holding plate overlapping the outer flange of the insulator block and the protrusion of the insulator block fitting into the opening of the cathode holding plate. Accordingly, the correct placement of these parts among themselves and when mounted on an arc chamber support is ensured. Moreover, due to the self-aligning properties no additional equipment or measuring devices are necessary to correctly arrange the parts of the cathode holding assembly.

The present invention also relates to an arc chamber support assembly of an ion implanter comprising the claimed cathode holding assembly and an arc chamber support. In this assembly the insulator block is secured to the arc chamber support by a fixing device extending from the insulator block to the arc chamber support through the hole in the protrusion of the insulator block and a second hole in the recess of the arc chamber support and fixed with a lock member arranged on the side of the arc chamber support.

The cathode holding assembly is placed with the protrusion of the insulator block into a recess of the arc chamber support corresponding to the protrusion of the insulator block. The arc chamber support has a hole, i.e., a second hole, in the recess such that the insulator block can be secured to the arc chamber support by a fixing device extending from the insulator block to the arc chamber support through the hole in the protrusion of the insulator block and the second hole in the recess of the arc chamber support. The fixing device, e.g., a screw, is fixed with a lock member, e.g., a lock nut, arranged on the side of the arc chamber support. Accordingly, a second gap is defined extending between the arc chamber support and the cathode holding plate, then between the cathode holding plate and the insulator block where it ends.

In a preferred embodiment of the invention, the fixing device is a screw and the lock member is a lock nut.

In a further preferred embodiment, the arc chamber support comprises—in addition to the corresponding recess—an outer flange and an inner rib towards the cathode holding plate and the cathode holding plate comprises at least two protruding ribs towards the arc chamber support. In this case where the at least two protruding ribs of the cathode holding plate towards the arc chamber support overlap with the outer flange and the inner rib of the arc chamber support the second gap is extended to provide a tortuous path between the arc chamber support and the cathode holding assembly, then between the cathode holding plate and the insulator block where it ends.

The second gap is very small compared to the gaps known from the prior art when using an arc chamber support having one projection towards the ion source assembly. The size of the second gap according to the present invention is 2 mm, preferably 0.4 to 1.5 mm, more preferably 0.5 to 1.0 mm. Accordingly, by using the claimed arc chamber support assembly the size of the second gap can be minimized resulting in a reduced gas lost in the arc chamber during ion beam operation.

Moreover, as already outlined above the second gap generates an extended tortuous path which comprises due to the specific design of the different parts of the cathode holding assembly and the arc chamber support when viewed in the direction from a side of the arc chamber support at least seven turns.

In a preferred embodiment the protrusion of the insulator block comprises at least one surrounding groove between opening of the cathode holding plate and recess of the arc chamber. Accordingly, the second gap further extends into the surrounding groove of the insulator block where it ends providing a prolonged second gap having at least eight turns. Moreover, by providing for example two surrounding grooves in the protrusion of the insulator block the second gap is prolonged by a side branch. The side branch preferably extends into the insulator block. Also, the side branch has preferably a width of 2 mm, preferably 0.4 to 1.5 mm, more preferably 0.5 to 1.0 mm. Accordingly, the plasma path is prolonged when compared to the paths disclosed in the prior art due to the specific design of the parts of the arc chamber support assembly. During the ion beam operation of the arc chamber such an extended tortuous path delays the buildup of a conductive plasma layer on the surface of the parts of the repeller assembly. Thereby the lifetime of a cathode assembly during ion beam operation is increased.

As already outlined above the parts of the arc chamber support assembly are self-aligning along a longitudinal main direction of extent of the fixing device extending through the insulator block and the arc chamber support when assembling them together. The longitudinal main direction of extent (x-direction/axial direction) of the fixing device corresponds to the cylindrical axis direction of the fixing device if the fixing device is a screw. So, these parts are positioned with respect to the axial direction in the correct distance to each other and with respect to the radial direction (which is perpendicular to the axial direction) also correctly and firmly positioned to each other. Moreover, due to the self-aligning properties only a low number of fixtures is required to assembly the arc chamber support assembly. This is advantageous because the claimed arc chamber support assembly provides a cathode assembly that shows superior performance and longer service life than poorly/wrong aligned assemblies.

With the above and other objects in view there is also provided, in accordance with the invention, an arc chamber assembly of an ion implanter comprising the arc chamber support as summarized above and an arc chamber positioned on the arc chamber support.

Other features which are considered as characteristic for the invention are set forth in the appended claims.

Although the invention is illustrated and described herein as embodied in a cathode holding assembly and arc chamber support assembly with the cathode holding assembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
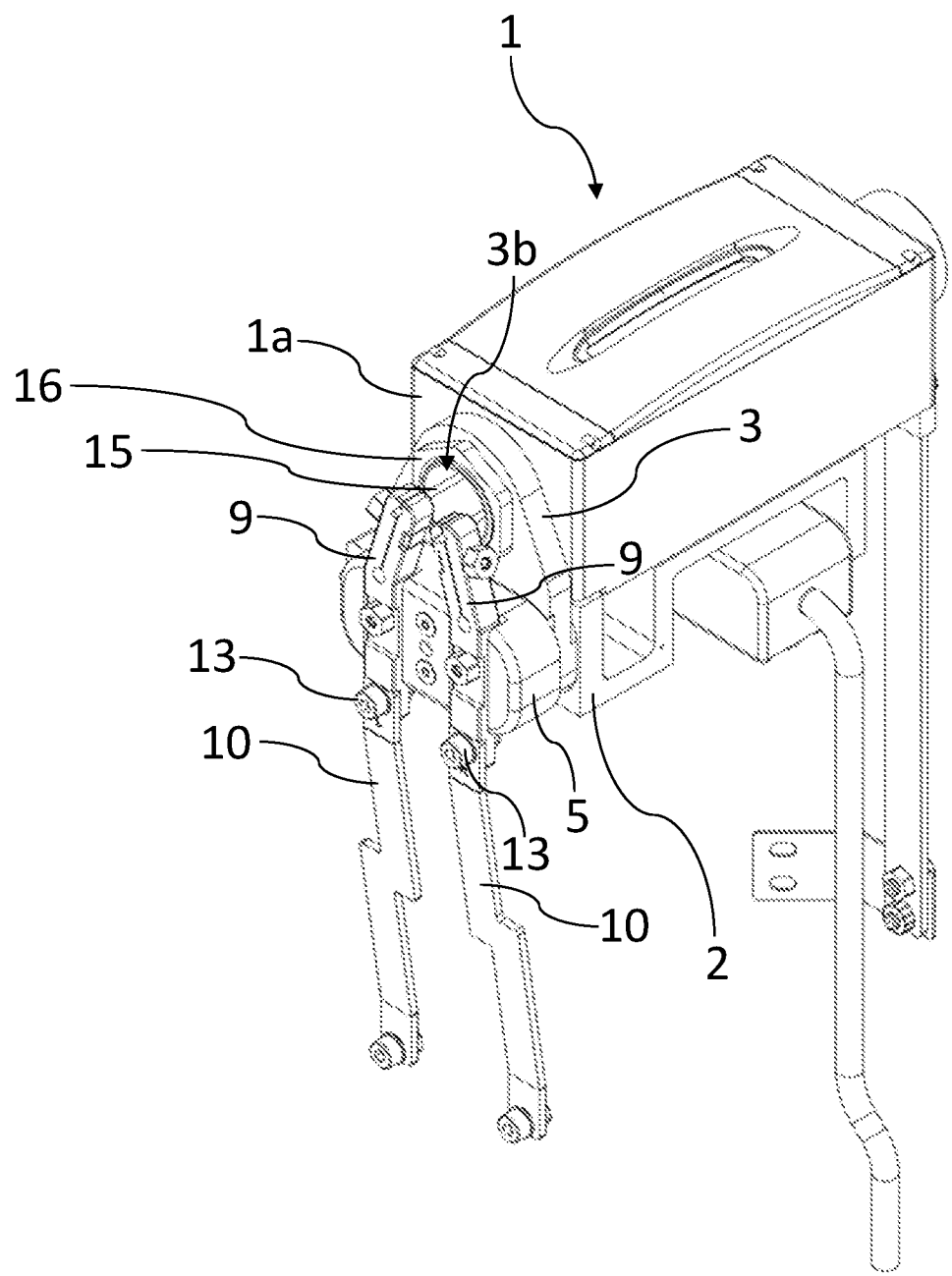
FIG. 1 illustrates a perspective view of an arc chamber for an ion implanter in accordance with the invention.

Referring now to the figures of the drawing in detail and first, in particular, to FIG. 1 thereof, there is shown an exterior perspective view of an arc chamber 1 of an ion implanter. The arc chamber 1 includes a cathode holding assembly according to the present invention. The cathode holding assembly is mounted on an arc chamber support 2. The arc chamber 1, inter alia, has one outer wall, i.e., a front wall 1a, at one end of the arc chamber with an opening for mounting the cathode. On the opposite side of the cathode a repeller assembly is located. The figure shows a cathode holding plate 3 having in an upper end an aperture 3b towards the opening of the arc chamber where the cathode is located. In this upper end of the cathode holding plate a filament 15 is mounted extending into the cavity of the arc chamber where a cathode is located (not visible in this figure). A shaftless cathode retainer 16 is placed around the aperture 3b. The lower end of the cathode holding plate 3 is attached to an arc chamber support 2. This lower end of the cathode holding plate 3 is covered by a shield cap 5. The insulator block of the cathode holding assembly is not visible in this figure. Filament clamps 9 are attached to the insulator block 4 (see, FIG. 2) and are fixed to filament straps 10 by lock nuts 13. It is evident from FIG. 1 that the arc chamber support 2 is sized to support the arc chamber 1 and only the lower end of the cathode holding plate is mounted to the arc chamber support 2.

Figure 2:
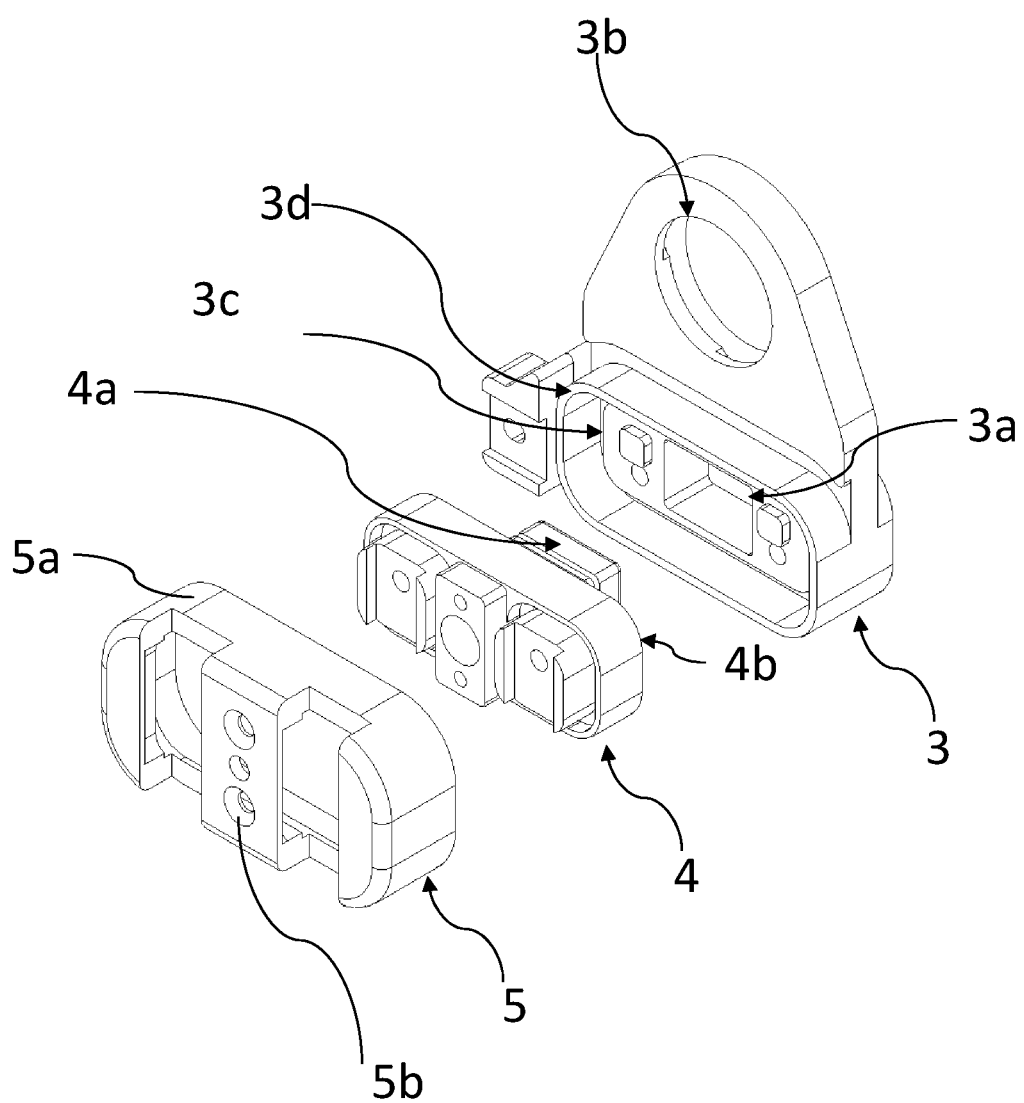
FIG. 2 illustrates an exploded perspective view of a cathode holding assembly in accordance with the invention.

FIG. 2 illustrates the claimed cathode holding assembly. The figure shows a cathode holding plate 3 having an opening 3a of rectangular shape in a lower end of the cathode holding plate and an aperture 3b of circular shape in an upper end of the cathode holding plate. Moreover, the cathode holding plate comprises (on the side facing the shield cap and insulator block) a protruding outer rib 3d and a protruding inner rib 3c. The insulator block 4 comprises inter alia a protrusion 4a and an outer flange 4b towards the cathode holding plate. The protrusion 4a is passed through the opening 3a of the cathode holding plate when the insulator block is attached to the cathode holding plate, whereby the protruding outer rib 3d of the cathode holding plate 3 overlaps the outer flange 4b of the insulator block 4. A shield cap 5 is attached to the assembly of the insulator block/cathode holding plate. A surrounding flange 5a of the shield cap 5 that extends towards the cathode holding plate overlaps the protruding outer rib 3d of the cathode holding plate 3. All parts of the cathode holding assembly are self-aligning along an assembling direction when assembling them together due to the specific geometric design (e.g., protrusions and depressions) of the parts.

Figure 3:
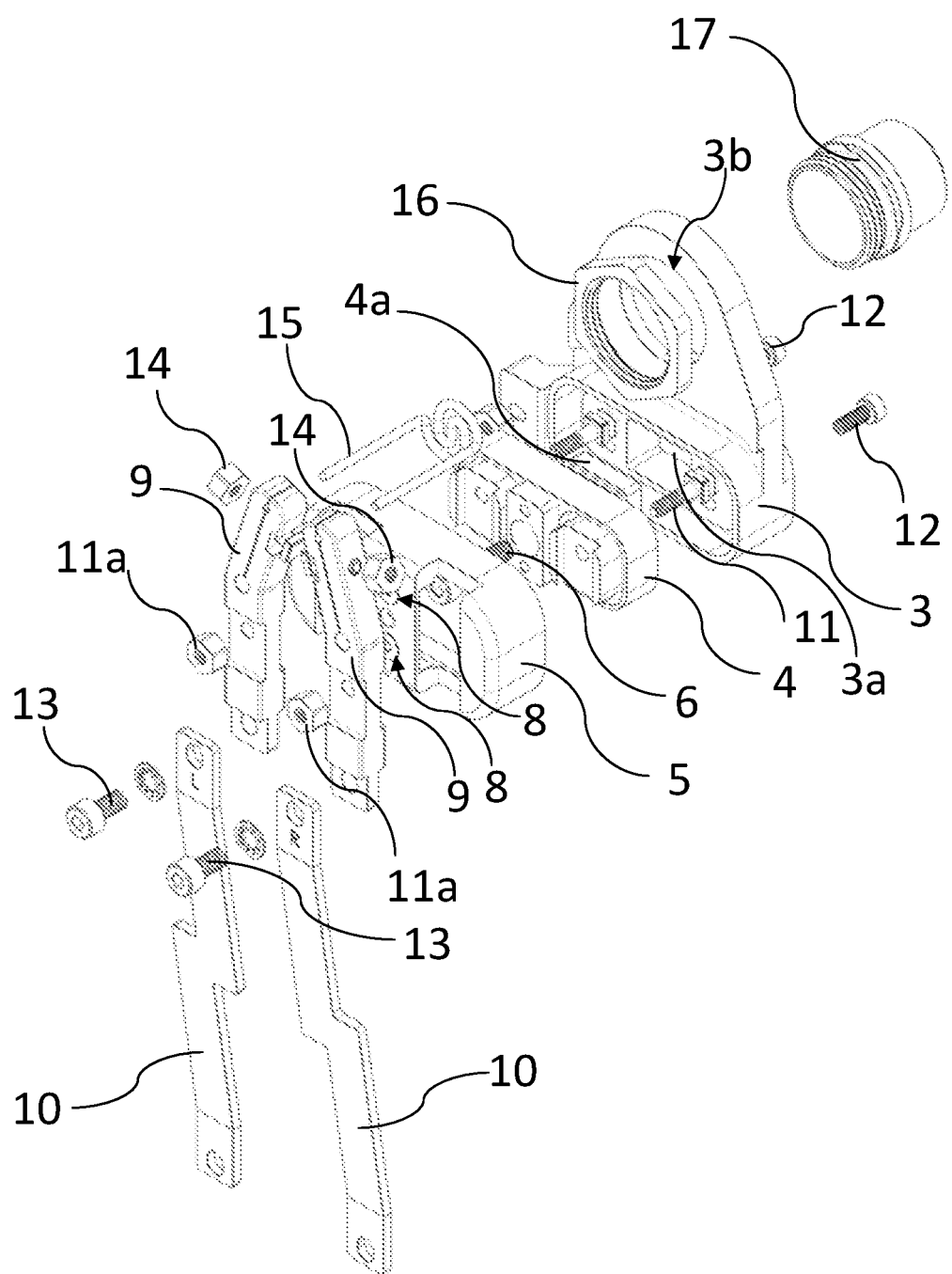
FIG. 3 illustrates an exploded perspective view of a cathode assembly (ion source assembly) including a cathode holding assembly in accordance with the invention as well as filament clamps, filament straps, cathode retainer, screws, bolts, and nuts, etc.

FIG. 3 shows the claimed cathode holding assembly of FIG. 2 associated with further parts of a cathode assembly to be mounted on an arc chamber support such that a filament extends into a cavity of the arc chamber. This Fig. shows inter alia the cathode holding plate 3, the insulator block 4, and the shield cap 5 as well as the fixing device 6, 8, 11, 12 and 13 and lock members 11a, 14. The parts of the cathode holding assembly are assembled together whereby the two fixing device 11, e.g., square head screws, are introduced into the insulator block 4 from the side of the cathode holding plate and passes through the insulator block, the shield cap 5 and the filament clamps 9 and are fixed by lock members 11a, e.g., lock nuts, onto a side of the filament clamps 9 opposing the shield cap. The cathode holding plate is attached to the insulator block by two fixing device 12, e.g., screws, introduced into the cathode holding plate from the arc chamber support side. The protrusion 4a of the insulator block 4 is passed through the opening 3a of the cathode holding plate 3. Additionally, a fixing mean 6, e.g., a screw, is fully passed throughout a hole (not visible in this Fig.) in the protrusion 4a of the insulator block 4 such that it is possible to attach the insulator block to the arc chamber support (not shown in this figure). The shield cap 5 is mounted to the insulator block 4 and is fixed only to the insulator block by two fixing device 8, e.g., screws, such that the shield cap is mounted to the insulator block in a floating arrangement and covers the insulator block and the protruding outer rib 3d of the cathode holding plate. The filament clamps 9 are placed on the insulator block 4 and as already outlined above are fixed by lock members 11a (e.g., lock nuts) such that the filament clamps 9 are attached to the assembly. Additionally, this figure shows the filament 15 that is introduced into an aperture 3b of the cathode holding plate. In this aperture 3b of the cathode holding plate a cathode 17 and a shaftless cathode retainer 16 are arranged. The figure shows additionally the filaments straps 10 attached to the filament clamps 9 by fixing device 13, e.g., screws.

All parts of the cathode holding assembly are assembled together along a longitudinal main direction of extent of the hole extending throughout the protrusion 4a of the insulator block 4, i.e., along the central axis of the hole or the fixing device 6 respectively. The figure shows that the cathode holding plate, the insulator block, and the shield cap are self-aligning along the longitudinal main direction of extent of the fixing device 6. Accordingly, the correct placement of the parts of the cathode assembly among themselves and when mounting on an arc chamber support is ensured. In a preferred embodiment screws are used for fixing the separate parts to each other. The number of fixations normally necessary in assemblies of the prior art can be reduced by the design of the cathode holding plate, the insulator block and the shield cap. Accordingly the cathode holding assembly is easy to assemble and minimize the number of tools normally required.

Figure 4A:
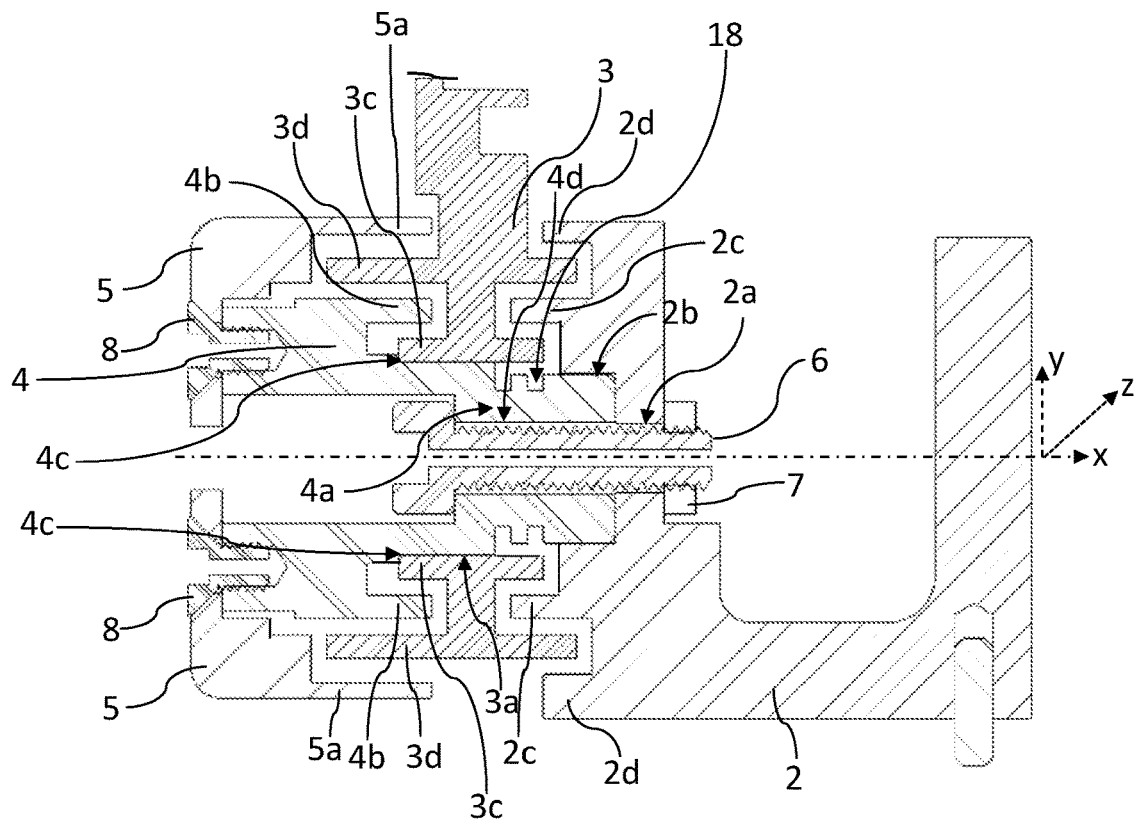
FIGS. 4A and 4B illustrate a sectional view of a cathode holding assembly mounted on an arc chamber support of an ion implanter as shown in FIG. 1 according to an embodiment of the invention.

FIG. 4A shows an embodiment of the claimed arc chamber support assembly comprising the claimed cathode holding assembly in sectional view. In this figure the cathode holding assembly is mounted on an arc chamber support 2. It is shown that the cathode holding plate 3 comprises a protruding outer rib 3d and a protruding inner rib 3c towards the shield cap. The protruding inner rib 3c is aligned with the opening 3a of rectangular shape of the cathode holding plate. Moreover, it is shown that the cathode holding plate has two protruding ribs towards the arc chamber support and the arc chamber support has an outer flange 2d and an inner rib 2c towards the cathode holding plate such that these outer flange 2d and inner rib 2c overlap with the protruding ribs of the cathode holding plate. When assembling the arc chamber support assembly, the protrusion 4a of the insulator block 4 is passed through the opening 3a of the cathode holding plate into a corresponding recess 2b of the arc chamber support 2. It is evident from the figure that the protrusion 4a of the insulator block precisely fits into the recess 2b provided in the arc chamber support 2. The prior art documents mentioned above show an arc chamber support having a projection that slide fits into the insulator block. However, none of the prior art documents shows an arc chamber support having a recess.

The insulator block 4 comprises an outer flange 4b which is overlapped by the protruding outer rib 3d of the cathode holding plate. Moreover, the insulator block comprises an edge whereby the protruding inner rib 3c of the cathode holding plate is attached such that the protrusion 4a of the insulator block precisely fits into the opening 3a of the cathode holding plate. The protrusion of the insulator block comprises a hole 4d extending throughout the protrusion of the insulator block. A fixing device 6 is introduced into this hole 4d from the side opposing the cathode holding plate such that the insulator block is fixed to the arc chamber support by a lock member 7, e.g., a lock nut. To do so also the recess of the arc chamber support provides a hole, i.e., the second hole, and the lock nut is arranged on the side of the arc chamber support.

The shield cap 5 is attached to the insulator block by two fixing device 8 such that the shield cap is in floating arrangement to the insulator block. The shield cap has a surrounding flange 5a which covers the protruding outer rib 3d of the cathode holding plate.

In this embodiment, the parts of the arc chamber support assembly are self-aligning when assembling the parts together along a longitudinal main direction of extent of the fixing device 6. The longitudinal main direction of extent is shown in this Fig. as the x-axis (axial direction). The parts of the arc chamber support assembly have a geometrical shape that makes it possible that the parts are self-aligning correctly in fixed positions in x-direction, y-direction and z-direction. Accordingly, the claimed cathode holding assembly can be easily mounted on the arc chamber support without additional equipment or measuring devices that are normally necessary to correctly arrange the parts of a cathode assembly into an opening in the wall of the arc chamber.

Figure 4B:
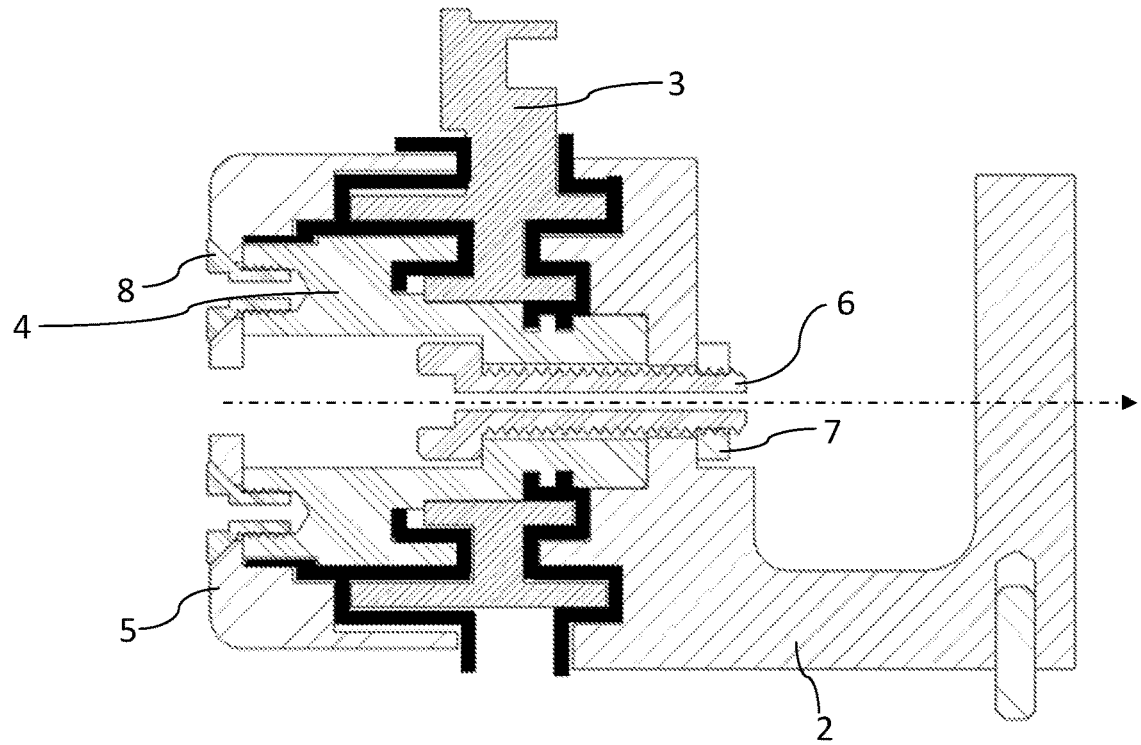

FIG. 4B shows the same arc chamber support assembly as FIG. 4A but highlights a gap and a second gap that are defined if the cathode holding assembly is mounted on an arc chamber support. The gap extends between the cathode holding plate and the shield cap, then extends between the cathode holding plate and the insulator block where it ends. In this embodiment a side branch is shown between the shield cap and the insulator block. The black line marks the flow of plasma/gas from the inner side/inside of an arc chamber towards the outer side/outside of an arc chamber. It is shown that the gas flows along the shield cap, then between the cathode holding plate and the shield cap, and then between the cathode holding plate and the insulator block where it ends. Accordingly, it is possible to provide an extended tortuous gap for the plasma flow of seven turns and one side branch (viewing in the direction from the shield cap). Accordingly, the time until the whole gap is coated with plasma is prolonged leading to a longer lifetime extension of the arc chamber. In addition, FIG. 4B shows a further gap. This further gap extends between the cathode holding plate and the arc chamber support, and then between the arc chamber support and the insulator block where it ends. In this preferred embodiment the protrusion of the insulator block has two surrounding grooves such that the second gap furthermore extends into the insulator block where it ends. In this figure an extended tortuous second gap for the plasma flow is provided having seven turns and a side branch. The figure also shows that the gap as well as the second gap show along its entire length a width of the gap which is 2 mm.

The claimed invention thus provides a cathode holding assembly that, when it is mounted on an arc chamber support of an ion implanter, improves the life performance of the ion implanter during ion beam operation. Accordingly, the claimed invention reduces the frequency of maintenance shutdowns in the arc chamber.

Due to the self-aligning design of the parts a correct installation of the cathode holding assembly is possible without using further equipment or measuring devices.

The following is a summary list of reference numerals and the corresponding structure used in the above description of the invention:

1 arc chamber
1a front wall of arc chamber
2 arc chamber support
2a opening of the arc chamber support
2b recess of the arc chamber support
2c inner rib of arc chamber support
2d outer flange of the arc chamber support
3 cathode holding plate
3a opening of rectangular shape cathode holding plate
3b aperture of circular shape of cathode holding plate
3c protruding inner rib of cathode support plate towards shield cap
3d protruding outer rib of cathode support plate towards shield cap
4 insulator block
4a protrusion of insulator block towards the cathode holding plate
4b outer flange of insulator block towards the cathode holding plate
4c edge of insulator block
5 shield cap
5a surrounding flange of shield cap
5b hole for fixing device of shield cap to insulator block
6 fixing device, preferably a screw
7 lock member, preferably a lock nut
8 screw
9 filament clamp
10 filament strap
11 fixing member, e.g., square-head screw
11a, 14 lock member, e.g., lock nut
12, 13 fixing member, e.g., a screw
15 filament
16 shaftless cathode retainer
17 cathode

The invention claimed is:

1. A cathode holding assembly to be mounted on an arc chamber support of an ion implanter, the cathode holding assembly comprising:
   a cathode holding plate, an insulator block, and a shield cap;
   said cathode holding plate being formed with a protruding outer rib towards said shield cap and an opening having a protruding inner rib towards said shield cap;
   said insulator block being formed with a protrusion configured to be passed through said opening of said cathode holding plate and to be inserted into a corresponding recess of the arc chamber support, said protrusion of said insulator block being formed with a through-hole for affixing said insulator block to the arc chamber support;
   said insulator block abutting said protruding inner rib of said opening of said cathode holding plate at an edge of said insulator block, to ensure that said insulator block fits precisely into said opening of said cathode holding plate; and
   said shield cap being arranged on a side of said insulator block opposite said protrusion to define a gap extending from between said cathode holding plate and said shield cap, then between said cathode holding plate and said insulator block, and ending there.

2. The cathode holding assembly according to claim 1, wherein a width of said gap is ≤2 mm.

3. The cathode holding assembly according to claim 1, wherein said gap follows a tortuous path comprising at least six turns and at least one side branch.

4. The cathode holding assembly according to claim 1, wherein said shield cap is secured only to said insulator block by at least one fixing device extending from said shield cap into said insulator block.

5. The cathode holding assembly according to claim 1, wherein said shield cap is disposed to cover said insulator block and said protruding outer rib of said cathode holding plate only.

6. The cathode holding assembly according to claim 1, wherein individual parts of said cathode holding assembly are geometrically designed to be self-aligning along an assembly direction when said parts are assembled together.

7. The cathode holding assembly according to claim 1, wherein said shield cap comprises a surrounding flange extending towards said cathode holding plate, said protruding outer rib of said cathode holding plate is disposed inside said surrounding flange and is overlapped by said surrounding flange, and said insulator block is formed with an outer flange extending inside said protruding outer rib and towards said cathode holding plate.

8. The cathode holding assembly according to claim 1, wherein said cathode holding plate is made of a refractory metal or of a refractory-based metal.

9. An arc chamber support assembly of an ion implanter, the arc chamber support assembly comprising:
   an arc chamber support and a cathode holding assembly according to claim 1 mounted to said arc chamber support;
   the insulator block being secured to said arc chamber support by a fixing device extending from the insulator block to said arc chamber support through the hole in the protrusion of the insulator block and a second hole in the recess of the arc chamber support and being fixed with a lock member disposed on a side of said arc chamber support.

10. The arc chamber support assembly according to claim 9, wherein said fixing device is a screw, and said lock member is a lock nut.

11. The arc chamber support assembly according to claim 9, wherein said arc chamber support comprises an outer flange and an inner rib towards said cathode holding plate and said cathode holding plate is formed with at least two protruding ribs towards said arc chamber support, with said ribs overlapping said outer flange and said inner rib of said arc chamber support to define a second gap extending between said cathode holding plate and said arc chamber support, then between said cathode holding plate and said insulator block, and ending there.

12. The arc chamber support assembly according to claim 11, wherein the protrusion of the insulator block is formed with at least one surrounding groove and said second gap extends into said at least one groove of the insulator block and ends there.

13. The arc chamber support assembly according to claim 11, wherein a width of said second gap is ≤2 mm.

14. The arc chamber support assembly according to claim 11, wherein said second gap forms a tortuous path comprising at least seven turns.

15. The arc chamber support assembly according to claim 9, wherein said shield cap, said insulator block, said cathode holding plate, and said arc chamber support are geometrically configured to self-align along a longitudinal main direction of extent of said fixing device extending through said insulator block and said arc chamber support upon an assembly thereof.

16. An arc chamber assembly of an ion implanter, the arc chamber assembly comprising an arc chamber support assembly according to claim 9 and an arc chamber positioned on said arc chamber support.

* * * * *